United States Patent
Chung et al.

(10) Patent No.: US 8,324,095 B2
(45) Date of Patent: *Dec. 4, 2012

(54) INTEGRATION OF ALD TANTALUM NITRIDE FOR COPPER METALLIZATION

(75) Inventors: Hua Chung, San Jose, CA (US); Nirmalya Maity, Los Altos, CA (US); Jick Yu, San Jose, CA (US); Roderick Craig Mosely, Pleasanton, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 264 days.

This patent is subject to a terminal disclaimer.

(21) Appl. No.: 12/627,977

(22) Filed: Nov. 30, 2009

(65) Prior Publication Data

US 2010/0075494 A1    Mar. 25, 2010

Related U.S. Application Data

(63) Continuation of application No. 11/368,191, filed on Mar. 3, 2006, now abandoned, which is a continuation of application No. 10/865,042, filed on Jun. 10, 2004, now Pat. No. 7,049,226, which is a continuation-in-part of application No. 10/193,333, filed on Jul. 10, 2002, now abandoned, and a continuation-in-part of application No. 09/965,370, filed on Sep. 26, 2001, now abandoned, and a continuation-in-part of application No. 09/965,373, filed on Sep. 26, 2001, now Pat. No. 6,936,906, and a continuation-in-part of application No. 09/965,369, filed on Sep. 26, 2001, now abandoned.

(60) Provisional application No. 60/478,663, filed on Jun. 13, 2003, provisional application No. 60/346,086, filed on Oct. 26, 2001.

(51) Int. Cl.
*H01L 21/768* (2006.01)

(52) U.S. Cl. ........ 438/643; 438/653; 438/685; 438/687; 438/710; 257/E21.584

(58) Field of Classification Search .................. 438/627, 438/643, 653, 685, 687, 710
See application file for complete search history.

(56) References Cited

U.S. PATENT DOCUMENTS 5,913,147 A   6/1999   Dubin et al.
6,498,091 B1  12/2002  Chen et al.
(Continued)

FOREIGN PATENT DOCUMENTS

JP    11-297696    10/1999
(Continued)

OTHER PUBLICATIONS

Official Action issued Feb. 17, 2011 in Japanese Application No. 2006-533817.

(Continued)

*Primary Examiner* — Alexander Ghyka
(74) *Attorney, Agent, or Firm* — Patterson & Sheridan, LLP

(57) ABSTRACT

A method and apparatus for depositing a tantalum nitride barrier layer is provided for use in an integrated processing tool. The tantalum nitride is deposited by atomic layer deposition. The tantalum nitride is removed from the bottom of features in dielectric layers to reveal the conductive material under the deposited tantalum nitride. Optionally, a tantalum layer may be deposited by physical vapor deposition after the tantalum nitride deposition. Optionally, the tantalum nitride deposition and the tantalum deposition may occur in the same processing chamber.

15 Claims, 13 Drawing Sheets

U.S. PATENT DOCUMENTS

| | | |
|---|---|---|
| 6,713,381 B2 | 3/2004 | Barr et al. |
| 6,936,906 B2 | 8/2005 | Chung et al. |
| 7,049,226 B2 | 5/2006 | Chung et al. |
| 7,053,487 B2 | 5/2006 | Saito et al. |
| 7,352,048 B2 | 4/2008 | Chung et al. |
| 7,494,908 B2 | 2/2009 | Chung et al. |
| 2002/0060363 A1 | 5/2002 | Xi et al. |
| 2003/0082301 A1 | 5/2003 | Chen et al. |
| 2006/0148253 A1 | 7/2006 | Chung et al. |

FOREIGN PATENT DOCUMENTS

| | | |
|---|---|---|
| JP | 11-340229 | 12/1999 |
| JP | 2002521842 T | 7/2002 |
| JP | 2003152077 A | 5/2003 |
| WO | WO-0007236 A2 | 2/2000 |
| WO | WO-03038892 | 5/2003 |

OTHER PUBLICATIONS

Final Rejection issued Sep. 21, 2010 in Japanese Application No. 2003-531517.

Office Action dated Sep. 14, 2011 for Korean Patent Application No. 10-2005-7023971.

Prosecution History for U.S. Appl. No. 11/368,191, Jan. 15, 2010.

INTEGRATION OF ALD TANTALUM NITRIDE FOR COPPER METALLIZATION

CROSS-REFERENCE TO RELATED APPLICATIONS

This application is a continuation of U.S. patent application Ser. No. 11/368,191, filed Mar. 3, 2006 now abandoned, which is a continuation of U.S. patent application Ser. No. 10/865,042, filed Jun. 10, 2004, and issued as U.S. Pat. No. 7,049,226, which claims benefit of U.S. Provisional Patent Application Ser. No. 60/478,663, filed Jun. 13, 2003. U.S. patent application Ser. No. 10/865,042 is a continuation-in-part of U.S. patent application Ser. No. 10/193,333, filed Jul. 10, 2002 now abandoned, which claims the benefit of U.S. Provisional Patent Application Ser. No. 60/346,086, filed Oct. 26, 2001, is a continuation-in-part of U.S. patent application Ser. No. 09/965,370, filed on Sep. 26, 2001, now abandoned, is a continuation-in-part of U.S. patent application Ser. No. 09/965,373, filed on Sep. 26, 2001, now U.S. Pat. No. 6,936,906, and is a continuation-in-part of U.S. Ser. No. 09/965,369, filed on Sep. 26, 2001, now abandoned. All related applications are incorporated by reference herein.

BACKGROUND OF THE INVENTION

1. Field of the Invention

Embodiments of the present invention relate to a method for manufacturing integrated circuit devices. More particularly, embodiments of the invention relate to a system and process of utilizing ALD tantalum nitride layer in the formation of metal interconnect structures.

2. Description of the Related Art

As the structure size of integrated circuit (IC) devices is scaled down to sub-quarter micron dimensions, electrical resistance and current densities have become an area for concern and improvement. Multilevel interconnect technology provides the conductive paths throughout an IC device, and are formed in high aspect ratio features including contacts, plugs, vias, lines, wires, and other features. A typical process for forming an interconnect on a substrate includes depositing one or more layers, etching at least one of the layer(s) to form one or more features, depositing a barrier layer in the feature(s) and depositing one or more layers to fill the feature. Typically, a feature is formed within a dielectric material disposed between a lower conductive layer and an upper conductive layer. The interconnect is formed within the feature to link the upper and lower conductive layers. Reliable formation of these interconnect features is important to the production of the circuits and the continued effort to increase circuit density and quality on individual substrates.

Copper is a choice metal for filling sub-micron high aspect ratio interconnect features because copper and its alloys have lower resistivities than aluminum. However, copper diffuses more readily into surrounding materials and can alter the electronic device characteristics of the adjacent layers. The diffused copper can form a conductive path between layers thereby reducing the reliability of the overall circuit and may even result in device failure. Hence, barrier layers are deposited prior to copper metallization to prevent or impede the diffusion of copper atoms. Barrier layers typically are refractory metals such as tungsten, titanium, tantalum, and nitrides thereof, which all have a greater resistivity than copper.

To deposit a barrier layer within a feature, the barrier layer is typically deposited on the bottom of the feature as well as the sidewalls thereof. Adequate deposition of the barrier layer on sidewalls typically results in excess deposition on the bottom. The excess amount of the barrier layer on the bottom of the feature not only increases the overall resistance of the feature, but also forms an obstruction between higher and lower metal interconnects of a multi-layered interconnect structure.

There is a need, therefore, for an improved method for forming metal interconnect structures which minimizes the electrical resistance of the interconnect.

SUMMARY OF THE INVENTION

One embodiment of the present invention provides a method of forming a metal interconnect on a semiconductor substrate, comprising cleaning features formed in a dielectric layer and exposing a conductive material underlying the dielectric layer by generating a plasma in a remote plasma source, delivering radicals from the plasma to a first process chamber which contains the substrate, and contacting the features formed in the dielectric layer with the radicals prior to a barrier layer deposition; depositing a tantalum nitride layer by atomic layer deposition within the features at a pressure between 1 and 10 Torr at a temperature between 200 and 300° C. in a second process chamber; depositing a tantalum layer by physical vapor deposition over the tantalum nitride layer in a third process chamber; plasma etching the tantalum layer and the tantalum nitride in a fourth process chamber to remove at least a portion of the tantalum layer and the tantalum nitride layer at the bottom of the feature to reveal the conductive material; optionally depositing additional tantalum or copper by physical vapor deposition on the tantalum layer; and depositing a seed layer over the conductive material and the tantalum layer in a fifth processing chamber, wherein the first processing chamber, the second processing chamber, the third processing chamber, the fourth processing chamber, and the fifth processing chamber are located in an integrated tool.

An apparatus for forming a metal interconnect on a semiconductor substrate, comprising a first processing chamber for cleaning features formed in a dielectric layer and exposing a conductive material underlying the dielectric layer by generating a plasma in a remote plasma source, delivering radicals from the plasma to the first process chamber which contains the substrate, and contacting the features formed in the dielectric layer prior to a barrier layer deposition; a second process chamber for depositing a tantalum nitride layer by atomic layer deposition within the features at a pressure between 1 and 10 Torr at a temperature between 200 and 300° C.; a third process chamber for depositing a tantalum layer by physical vapor deposition over the tantalum nitride layer; a fourth process chamber for plasma etching the tantalum layer and the tantalum nitride to remove at least a portion of the tantalum layer and the tantalum nitride layer at the bottom of the feature to reveal the conductive material and optionally depositing additional tantalum or copper by physical vapor deposition on the tantalum layer; and a fifth processing chamber for depositing a seed layer over the conductive material and the tantalum layer, wherein the first processing chamber, the second processing chamber, the third processing chamber, the fourth processing chamber, and the fifth processing chamber are located in an integrated tool.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Barrier Deposition Process

Figure 1:
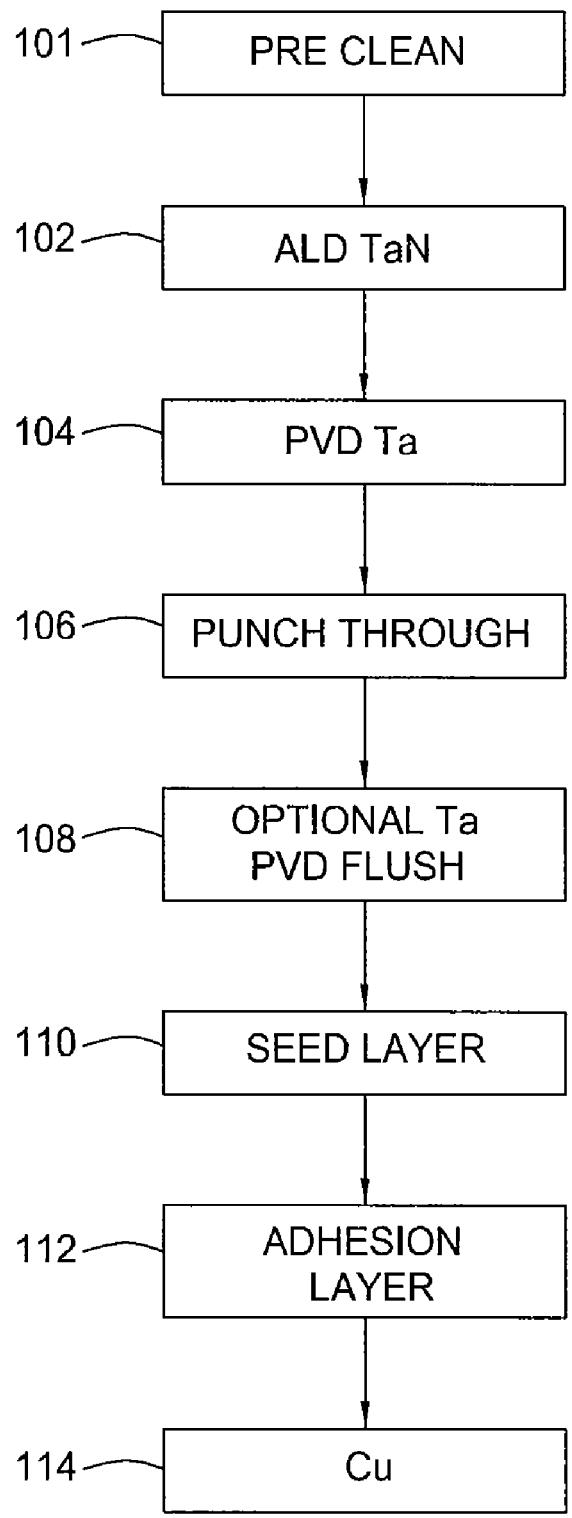
FIG. 1 illustrates one embodiment of a process of utilizing an ALD tantalum nitride layer in one stage in the formation of metal interconnect structures.

FIG. 1 illustrates one embodiment of a process of utilizing ALD tantalum nitride deposition in the formation of metal interconnect structures. In step 101, preconditioning occurs to prepare the surface for additional modification. The preconditioning options include nitrogen plasma, water plasma, hydrogen and helium plasma, low energy plasma, pre-flash with titanium or aluminum, or other precleaning process. In step 102, tantalum nitride is deposited by atomic layer deposition over a substrate structure. In step 104, a tantalum layer is deposited by physical vapor deposition over the tantalum nitride formed in step 102. In step 106, a punch-through step is performed to remove a portion of the tantalum nitride deposited in step 102 and to remove a portion of the tantalum deposited in step 104. In step 108, an optional titanium flash step may be performed to deposit tantalum by physical vapor deposition over the resulting substrate structure of step 106.

In step 110, a seed layer is formed over the resulting substrate structure of step 106 or step 108. After step 110, an optional adhesion layer deposition step 112 or copper or other deposition step 114 may occur.

Deposition Apparatus

Figure 4:
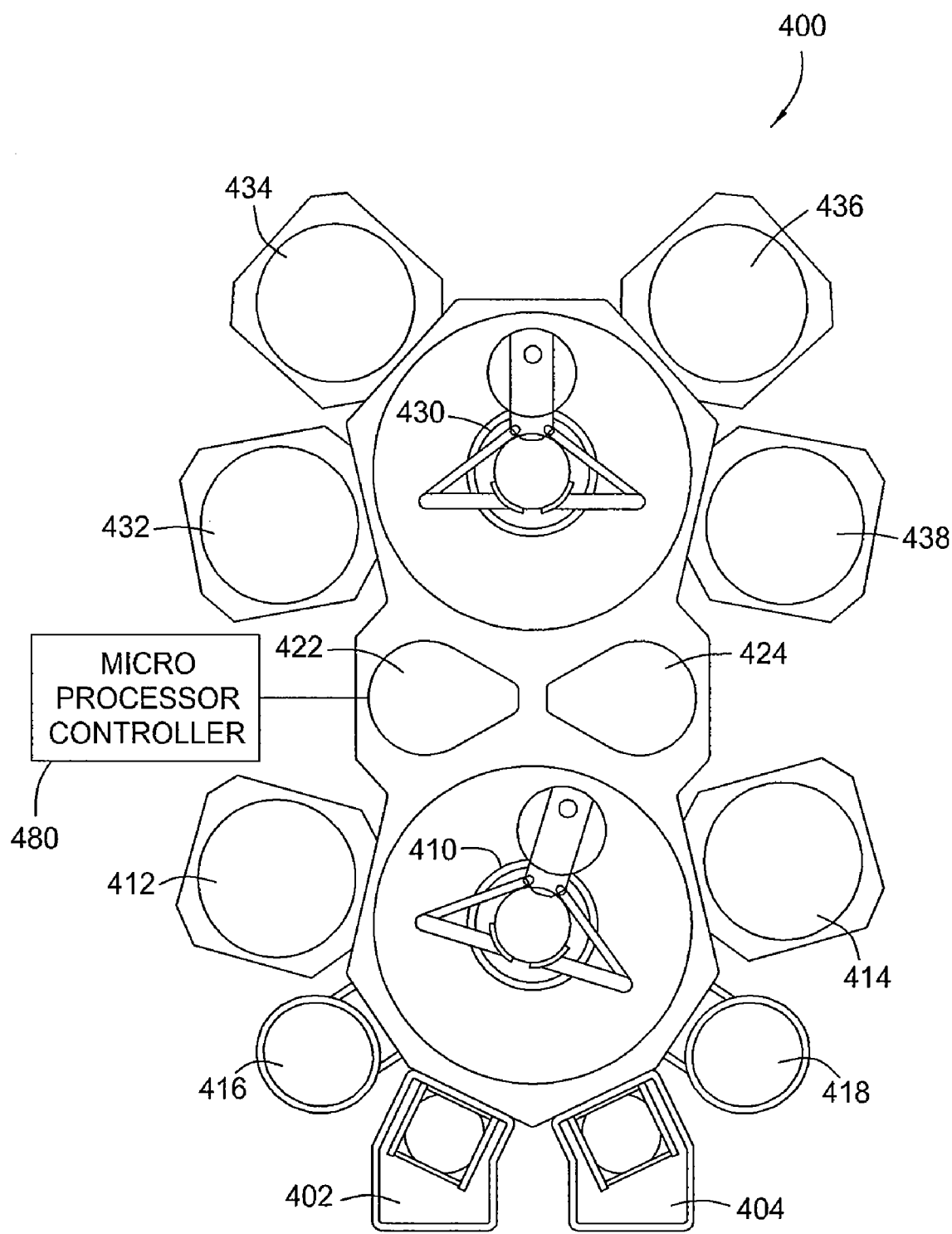
FIG. 4 illustrates a schematic plan view of an exemplary integrated cluster tool adaptable to perform the interconnect fabrication sequence described herein.

FIG. 4 is a schematic top-view diagram of an exemplary multi-chamber processing system 600 that may be adapted to perform processes as disclosed herein. Such a processing system 600 may be an Endura™ system, commercially available from Applied Materials, Inc., of Santa Clara, Calif. A similar multi-chamber processing system is disclosed in U.S. Pat. No. 5,186,718, entitled "Stage Vacuum Wafer Processing System and Method," issued on Feb. 16, 1993, which is incorporated by reference herein.

The system 400 generally includes load lock chambers 402 and 404 for the transfer of substrates into and out from the system 400. Typically, since the system 400 is under vacuum, the load lock chambers 402 and 404 may "pump down" the substrates introduced into the system 400. A first robot 410 may transfer the substrates between the load lock chambers 402 and 404 and a first set of one or more substrate processing chambers 412, 414, 416, and 418 (four are shown). Each processing chamber 412, 414, 416, and 418 can be outfitted to perform a number of substrate processing operations such as cyclical layer deposition including atomic layer deposition (ALD), chemical vapor deposition (CVD), physical vapor deposition (PVD), etch, pre-clean, de-gas, orientation and other substrate processes. The first robot 410 also transfers substrates to or from one or more transfer chambers 422 and 424.

The transfer chambers 422 and 424 are used to maintain ultrahigh vacuum conditions while allowing substrates to be transferred within the system 400. A second robot 430 may transfer the substrates between the transfer chambers 422 and 424 and a second set of one or more processing chambers 432, 434, 436, and 438. Similar to processing chambers 412, 414, 416, and 418, the processing chambers 432, 434, 436, and 438 can be outfitted to perform a variety of substrate processing operations, such as cyclical layer deposition including atomic layer deposition (ALD), chemical vapor deposition (CVD), physical vapor deposition (PVD), etch, pre-clean, degas, and orientation. Any of the substrate processing chambers 412, 414, 416, 418, 432, 434, 436, and 438 may be removed from the system 400 if not necessary for a particular process to be performed by the system 400.

Referring to FIG. 4, the processing system includes one or more atomic layer deposition (ALD) chambers configured to deposit barrier layers and one or more PVD chambers configured to deposit seed layers. To enhance efficiency and throughput of the system, one configuration of the processing system includes two ALD chambers configured to deposit barrier layers and two PVD chambers configured to deposit seed layers disposed in connection to the back-end central transfer chamber. In one configuration, the processing chambers 434 and 436 may be a tantalum nitride ALD chamber, processing chamber 432 and 438 may be a copper or tantalum PVD chamber.

In an additional configuration to perform the method of FIG. 1, processing chamber 434 may be a tantalum nitride atomic layer deposition chamber to perform step 102; processing chamber 432 may be a tantalum physical vapor deposition chamber to perform steps 104, 106, and 108; and processing chamber 412 may be a copper physical vapor deposition chamber to perform step 110 and possibly an etch step. In another example, chambers 436, 438, and 414 can mirror chambers 434, 432, and 412 respectively so that two sets of substrates may be processed in the integrated system.

These particular arrangements of the system 400 are provided to illustrate the invention and should not be used to limit the scope of the invention unless specifically set forth in the claims.

The Precleaning Process

The present invention provides a method for precleaning features on a semiconductor substrate to remove contaminants prior to metallization. The method includes removal of silicon dioxide from the bottom of contacts without damaging the silicon, removal of aluminum oxide or copper oxide from the bottom of vias without redeposition of the metal onto sidewalls, removal of a thin layer of silicon from the bottom of contact holes, and removal of contaminants from the sidewalls of the features.

The invention provides a suitable method for precleaning vias, contacts, and other features etched into a dielectric layer, such as a silicon dioxide layer, which is deposited on a conductive or semi-conductive sublayer, such as Ge, Si, Al, Cu, or TiN sublayers. The feature typically exposes the sublayer so that the feature can be filled with a conductive or semi-conductive material which connects the sublayer and a subsequent metal interconnect layer to be deposited on the dielectric layer. Etching of the features in the dielectric typically leaves contaminants which should be removed to improve filling of the features and ultimately improve the integrity and reliability of the devices formed.

After etching of the dielectric layer, the features can have damaged silicon or metal residues within the features from over-etching of the dielectric layer. The features can also contain residual photoresist on the feature surfaces from the photoresist stripping or ashing process or residual polymer from the dielectric etch step. The features may also contain redeposited material on the feature surfaces following a sputter etch preclean process. These contaminants can migrate into the dielectric layer or can interfere with the selectivity of metallization by promoting uneven distribution of the depositing metal. The presence of the contaminants also can increase the resistance of the deposited metal by substantially narrowing the width of the feature, creating a narrowed portion in the metal forming the via, contact line, or other conductive feature.

The precleaning method of the invention is especially useful for cleaning of submicron features having copper sublayers at the bottom of the features since copper is easily sputtered to the side walls in a conventional ICP or sputter etch based preclean chamber. The sputtered copper diffuses into the dielectric material causing device failure. The present invention cleans the via without sputtering of the base of the via.

Figure 5:
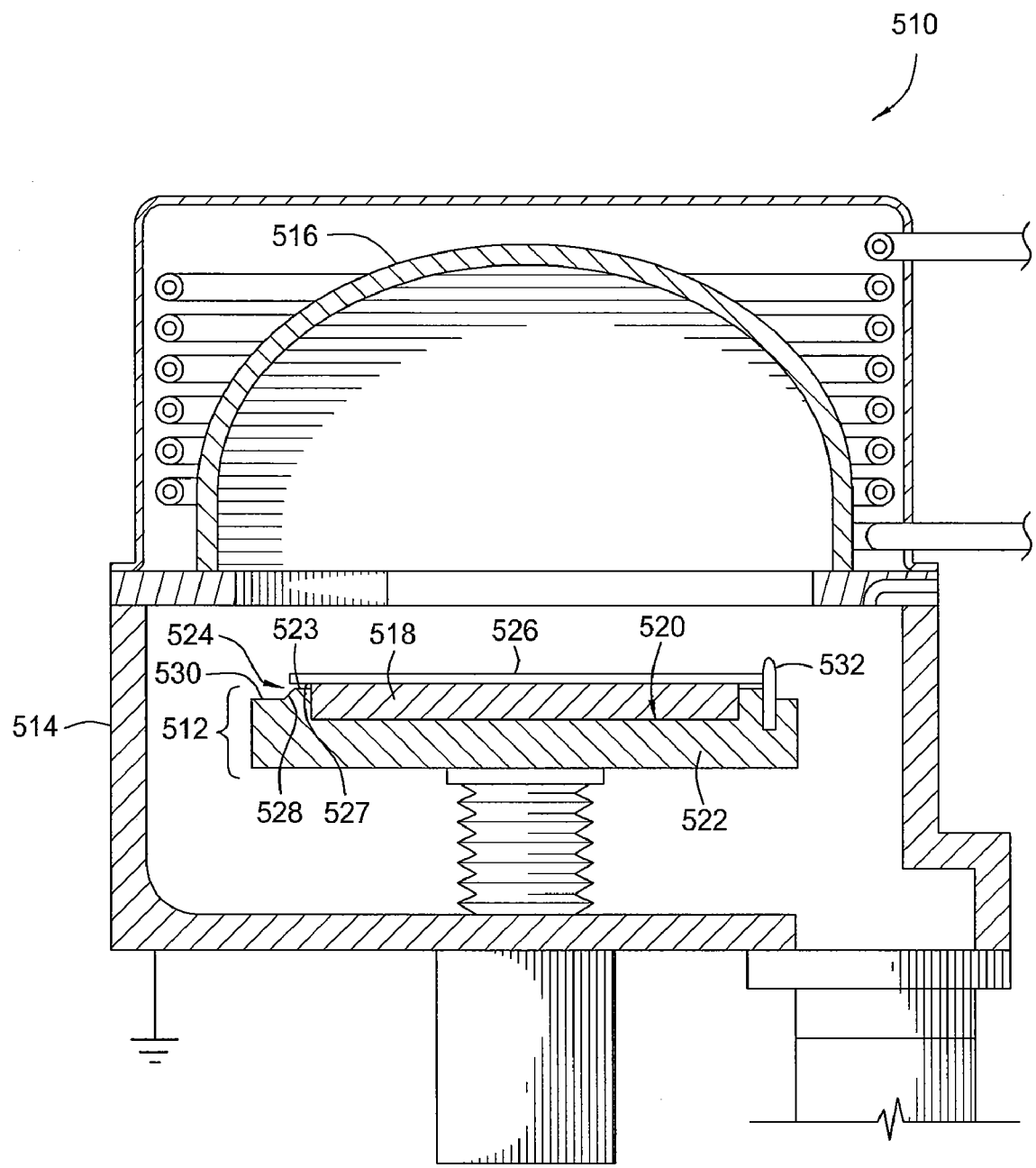
FIG. 5 illustrates a typical pre-clean chamber.

Referring to FIG. 5, the process for pre-cleaning the substrate 526 in the pre-clean chamber 510 may involve a reactive process or a sputter-etching process using the substrate 526 as the sputtering target. Generally, the reactive pre-clean process (step 101) may be performed on the substrate by introducing helium or a pre-clean gas mixture comprising hydrogen (less than about 10%) and helium into the chamber and providing RF power (between about 300 W and about 600 W at about 1 to 4 MHz) to a plasma generation coil. The substrate support may be biased between about 10 and 100 W. The chamber pressure may be maintained between about 40 mTorr and 200 mTorr during the pre-clean process. The reactive pre-clean process may be carried out for between about 30 seconds and 120 seconds. After the pre-clean process, the substrate is transferred to a chamber for deposition of a barrier layer and a seed layer over the surfaces of the substrate.

In one embodiment of the invention, the reactive pre-clean process (step 101) is performed on the substrate by introducing a pre-clean gas mixture comprising 5% hydrogen and 95% helium into the chamber and providing RF power to a coil at about 450 W at about 2.0 MHz. The substrate support is biased at about 1-200 W. The chamber pressure is maintained at about 80 mTorr during the pre-clean process. The reactive pre-clean process is carried out for about 60 seconds. After the pre-clean process, the substrate is transferred to a high density plasma physical vapor deposition chamber for deposition of a barrier layer and a seed layer over the surfaces of the substrate.

A Preferred Precleaning Apparatus

The precleaning process of the present invention is preferably conducted on a remote plasma source (RPS) chamber such as the Etch RPS chamber which is available from Applied Materials, Inc., Santa Clara, Calif. In a RPS chamber, reactive H radicals are formed by a remote plasma source and are introduced into the processing region as primarily neutral species, i.e., not having an electric charge and therefore not an ion, thereby preventing generation of self bias and bombardment of the wafer surface by ions. Experiments with RPS chambers show that a 2.45 GHz microwave source is more efficient and can generate more hydrogen radicals than lower frequency RF sources.

Barrier Layer Deposition

Figure 9A:
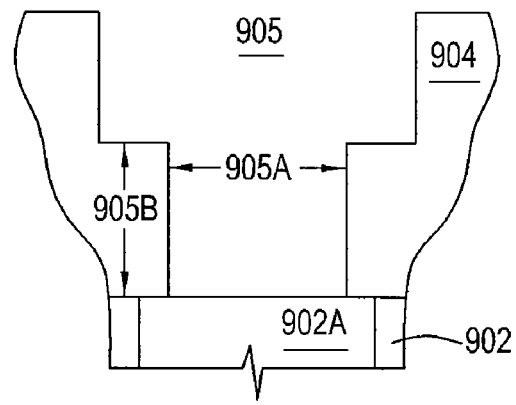
FIGS. 9A-9F are schematic representations of an exemplary substrate structure at various stages in the process of FIG. 1.

"Atomic layer deposition" as used herein refers to the sequential introduction of two or more compounds to deposit a thin layer on a substrate surface. The two or more compounds are sequentially introduced into a reaction zone of a processing chamber. Each compound is separated by a time delay or pause to allow each compound to adhere to or react on the substrate surface. In one aspect, a first compound, compound A, is dosed/pulsed into the reaction zone followed by a first time delay or pause. Next, a second compound or compound B is dosed/pulsed into the reaction zone followed by a second time delay. These sequential tandems of a pulse of reactive compound followed by a time delay may be repeated indefinitely until a desired film or film thickness is formed on the substrate surface FIGS. 9A-9F are schematic representations of an exemplary substrate structure at various stages in the process of FIG. 1. FIG. 9A shows a dielectric layer 904 formed over one or more underlying layers 902. The dielectric layer 904 may be any dielectric material including a low k dielectric material (k<4.0), whether presently known or yet to be discovered. For example, the dielectric layer 904 may be a silicon oxide or a carbon doped silicon oxide material. The dielectric layer has been patterned and etched to form an aperture 905 using conventional and well-known techniques. The aperture 905 may be used to form a plug, via, contact, line, wore, or any other interconnect component. As shown in FIG. 2A, the aperture 905 may be used to form an interconnect component in a dual damascene structure. The processes as disclosed herein may be used to particular advantage over an aperture 905 have a lower opening size 905A of about 0.22 μm or less and having a lower aspect ratio 905B of about 4:1 or greater, such as about 6:1.

The aperture 905 exposes at least a conductive portion 902A of a part of a lower level metal interconnect feature, such as a plug, via, contact, line, wire, metal gate electrode, etc. The conductive portion 902A may comprise any conductive material, such as aluminum, copper, tungsten, or combinations. The process as disclosed herein may be performed to advantage over a conductive portion 902A comprising copper, which will be discussed herein in greater detail.

Figure 9B:
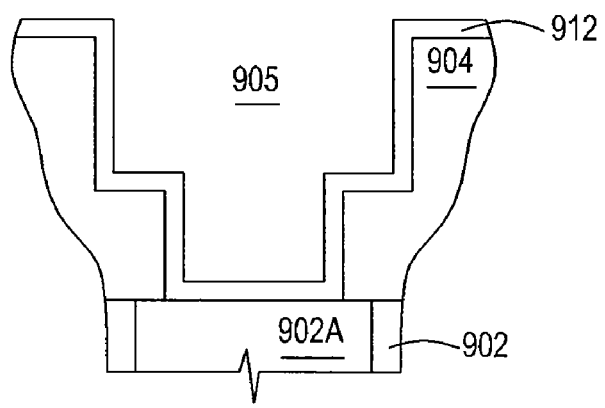

FIG. 9B shows a tantalum nitride layer 912 conformally deposited by atomic layer deposition, such as after step 102. The tantalum nitride layer is deposited to a thickness of about 50 Å or less, preferably between about 5 Å and about 20 Å. One of the advantages of atomic layer deposition over other conventional deposition techniques such as physical vapor deposition and chemical vapor deposition for tantalum nitride is the ability to deposit a conformal layer of tantalum nitride over the small openings, high aspect ratio, and varied topography of apertures, such as aperture 905, in the formation of interconnect structures. The heater temperature of the substrate support is maintained at a low temperature between about 100° C. and 300° C. In one aspect, it is believed that the low deposition temperature helps provide a more conformal tantalum nitride layer. Another of the advantages of the formation of an ALD tantalum nitride layer 912 over dielectric layer 904 is the good adhesion of the ALD tantalum nitride over dielectric materials.

The tantalum nitride layer deposited according to atomic layer deposition methods described herein shows evidence of an epitaxial growth phenomenon. In other words, the barrier layer takes on the same or substantially the same crystallographic characteristics as the underlying layer. As a result, a substantially single crystal is grown such that there is no void formation at an interface between the tantalum nitride layer and the underlying layer. Likewise, an additional tantalum layer deposited over the tantalum nitride layer exhibits the same or substantially the same epitaxial growth characteristics that continue the formation of the single crystal. Accordingly, no void formation is produced at this interface. The resulting structure resembling a single crystal eliminates void formation, thereby substantially increasing device reliability. The single crystal structure also reduces the overall resistance of the interconnect feature while still providing excellent barrier properties. Furthermore, it is believed that the single crystalline growth reduces the susceptibility of electromigration and stress migration due to the conformal and uniform crystalline orientation across the interconnect material interfaces.

Tantalum nitride may be deposited by atomic layer deposition by providing one or more pulses of a tantalum-containing compound at a flow rate between about 100 sccm and about 3,000 sccm for a time period of about 1.0 second or less and one or more pulses of a nitrogen-containing compound at a flow rate between about 100 sccm and about 3,000 sccm for a time period of about 1.0 second or less to a reaction zone having a substrate disposed therein.

Exemplary tantalum-containing compounds include: t-butylimino-tris(diethylamino)tantalum (TBTDET); pentakis ethylmethylamino) tantalum (PEMAT); pentakis(dimethylamino)tantalum (PDMAT); pentakis(diethylamino)tantalum (PDEAT); t-butylimino tris(ethylmethylamino) tantalum (TBTMET); t-butylimino-tris(dimethylamino)tantalum (TBTDMT); bis(cyclopentadienyl)tantalum trihydride ((Cp)$_2$TaH$_3$); bis(methylcyclopentadienyl) tantalum trihydride ((CpMe)$_2$TaH$_3$); derivatives thereof; and combinations thereof. Preferably, the tantalum-containing compound comprises PDMAT. Exemplary nitrogen-containing compounds include: ammonia; hydrazine; methylhydrazine; dimethyl hydrazine; t-butylhydrazine; phenylhydrazine; azoisobutane; ethylazide; derivatives thereof; and combinations thereof. Preferably, the nitrogen-containing compound comprises ammonia.

It is to be understood that these compounds or any other compound not listed above may be a solid, liquid, or gas at room temperature. For example, PDMAT is a solid at room temperature and TBTDET is a liquid at room temperature. Accordingly, the non-gas phase precursors are subjected to a sublimation or vaporization step, which are both well known in the art, prior to introduction into the processing chamber. A carrier gas, such as argon, helium, nitrogen, hydrogen, or a mixture thereof, may also be used to help deliver the compound into the processing chamber, as is commonly known in the art.

In a particular embodiment, a tantalum nitride layer having a thickness between 10 and 30 Angstroms is formed by atomic layer deposition by cyclically introducing PDMAT and ammonia to the substrate surface. To initiate the deposition of the tantalum nitride layer, a carrier/inert gas is introduced into the processing chamber 600 to stabilize the pressure and temperature therein. The carrier gas such as argon at a flow rate between 6000 to 10000 sccm is allowed to flow continuously during the deposition process such that only the argon flows between pulses of each compound. A first pulse of PDMAT is provided from the gas source 613 at a flow rate between about 400 sccm and about 1000 sccm, with a pulse time of about 2.0 seconds or less after the chamber temperature and pressure have been stabilized at about 200° C. to about 300° and about 1 Torr to about 5 Torr. A pulse of ammonia is then provided at a flow rate between about 1000 sccm and about 2000 sccm, with a pulse time of about 2.0 seconds or less.

A pause between pulses of PDMAT and ammonia is about 1.0 second or less, preferably about 0.5 seconds or less, more preferably about 0.1 seconds or less. In various aspects, a reduction in time between pulses at least provides higher throughput. As a result, a pause after the pulse of ammonia is also about 1.0 second or less, about 0.5 seconds or less, or about 0.1 seconds or less. Argon gas flowing between about 1,000 sccm and about 10,000 sccm, such as between about 3,000 sccm and about 6,000 sccm, is continuously provided. In one aspect, a pulse of PDMAT may still be in the chamber when a pulse of ammonia enters. In general, the duration of the carrier gas and pump evacuation should be long enough to prevent the pulses of PDMAT and ammonia from mixing together in the reaction zone.

The heater temperature is maintained between about 100° C. and about 300° C. at a chamber pressure between about 1.0 and about 5.0 Torr. Each cycle consisting of a pulse of PDMAT, pause, pulse of ammonia, and pause provides a tantalum nitride layer having a thickness between about 0.3 Å and about 1.0 Å per cycle. The alternating sequence may be repeated until the desired thickness is achieved.

A "pulse/dose" as used herein is intended to refer to a quantity of a particular compound that is intermittently or non-continuously introduced into a reaction zone of a processing chamber. The quantity of a particular compound within each pulse may vary over time, depending on the duration of the pulse. A particular compound may include a single compound or a combination of two or more compounds. The durations for each pulse/dose are variable and may be adjusted to accommodate, for example, the volume capacity of the processing chamber as well as the capabilities of a vacuum system coupled thereto. Additionally, the dose time of a compound may vary according to the flow rate of the compound, the pressure of the compound, the temperature of the compound, the type of dosing valve, the type of control system employed, as well as the ability of the compound to adsorb onto the substrate surface. Dose times may also vary based upon the type of layer being formed and the geometry of the device being formed. Typically, the duration for each pulse/dose or "dose time" is typically about 1.0 second or less. However, a dose time can range from microseconds to milliseconds to seconds, and even to minutes. In general, a dose time should be long enough to provide a volume of compound sufficient to adsorb or chemisorb onto the entire surface of the substrate and form a layer of the compound thereon.

A Preferred Atomic Layer Deposition Apparatus

Figure 6:
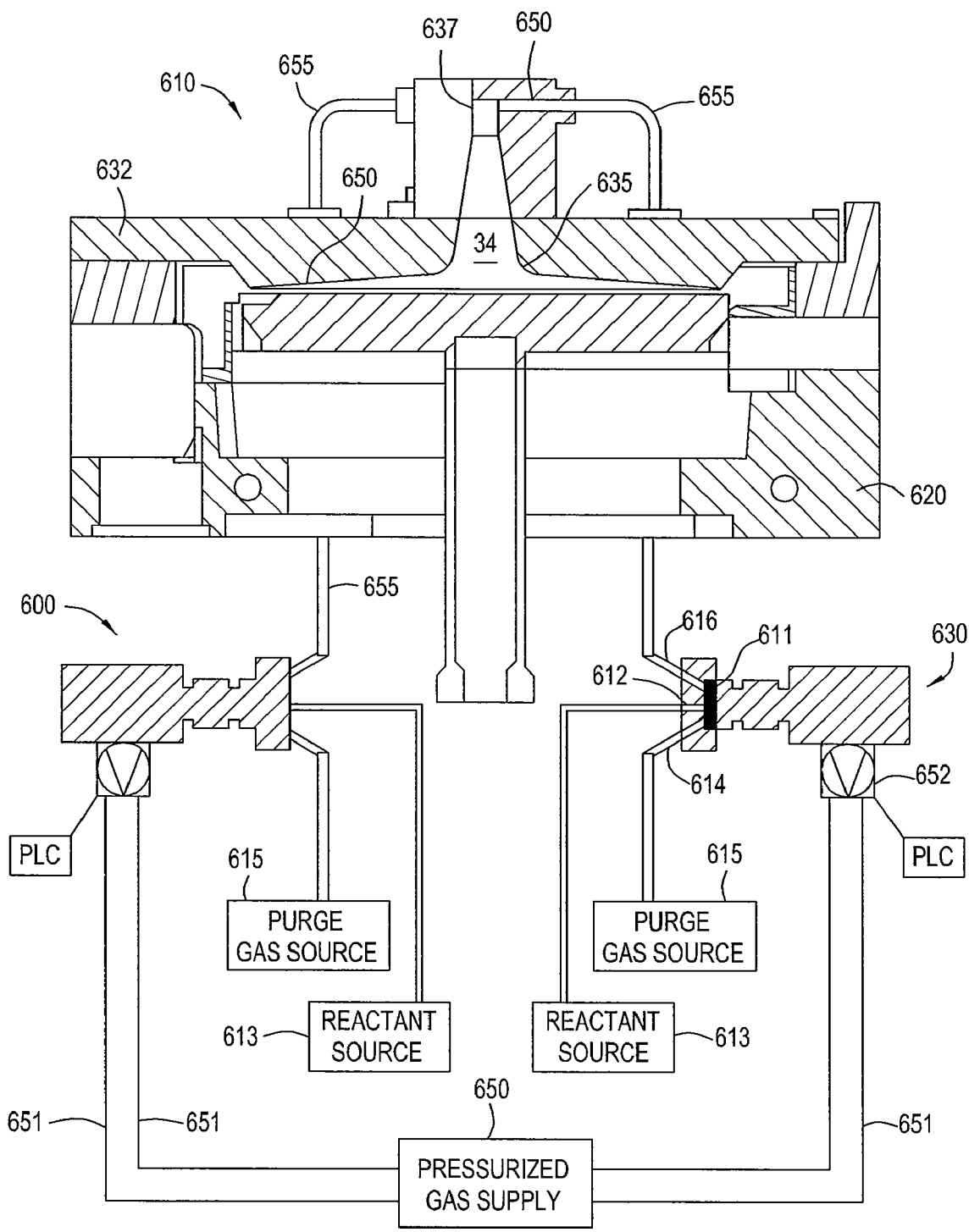
FIG. 6 illustrates a schematic, partial cross section of an exemplary processing chamber for forming a thin barrier layer according to a cyclical deposition technique.
Figure 7:
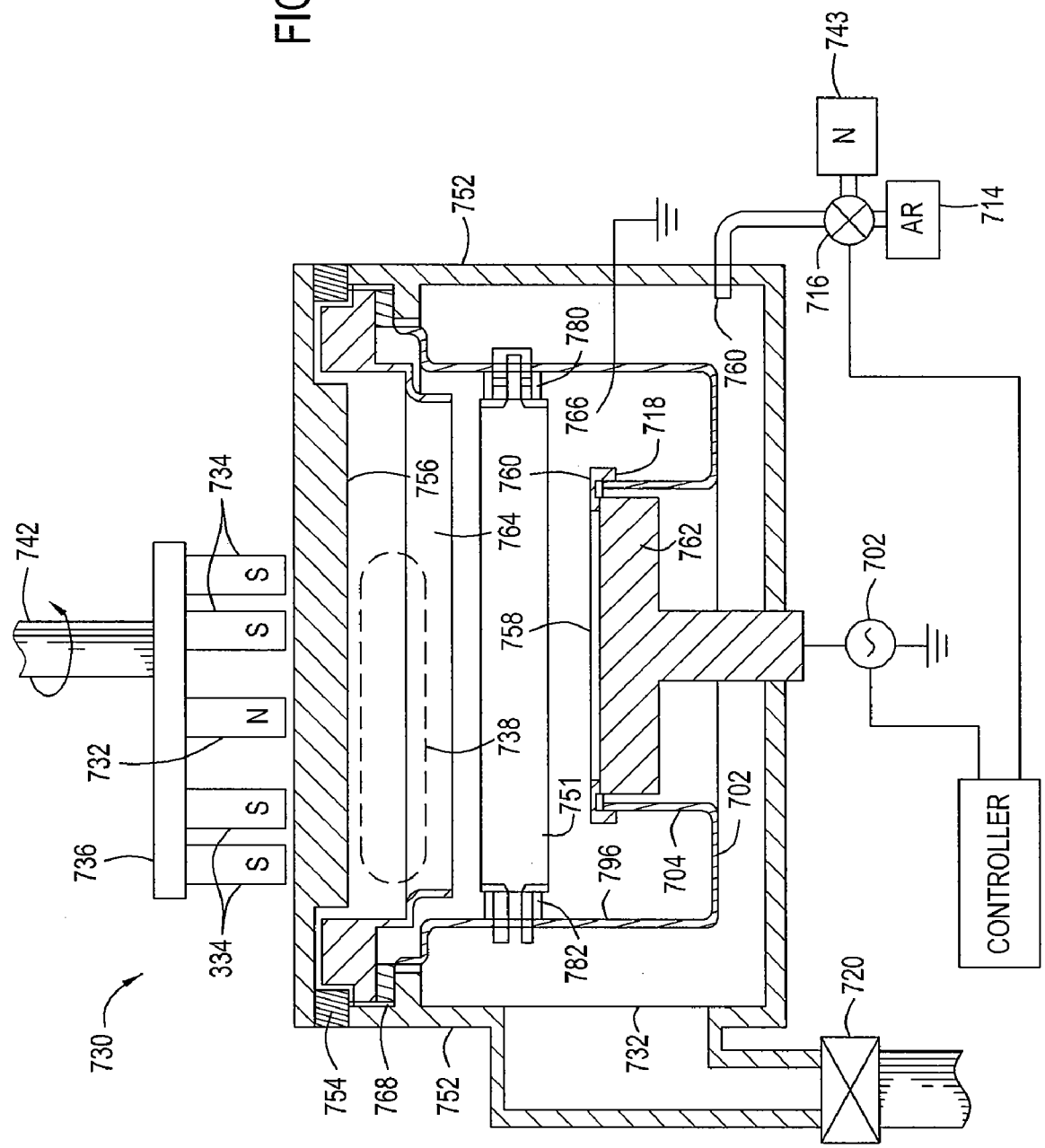
FIG. 7 illustrates a schematic, partial cross section of an exemplary processing chamber for forming a thin metal layer according to a physical vapor deposition technique.
Figure 8:
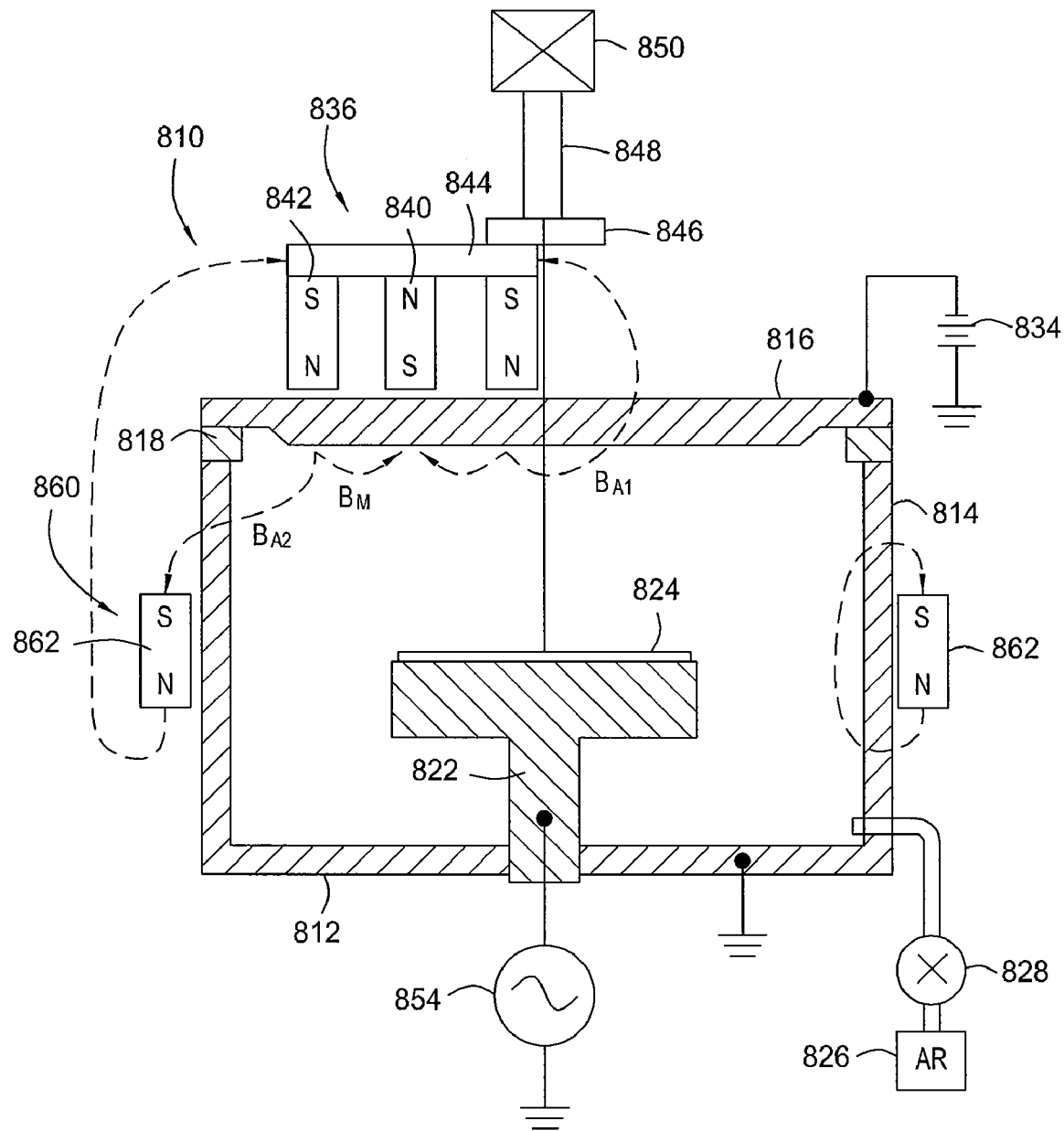
FIG. 8 illustrates a schematic, partial cross section of an exemplary processing chamber for forming a thin seed layer or adhesion layer.

FIG. 6 illustrates a schematic, partial cross section of an exemplary processing chamber 600 for forming a barrier layer according to embodiments of the present invention. Such a processing chamber 600 is available from Applied Materials, Inc. located in Santa Clara, Calif., and a brief description thereof follows. A more detailed description may be found in commonly assigned U.S. patent application Ser. No. 10/032,284, entitled "Gas Delivery Apparatus and Method For Atomic Layer Deposition", filed on Dec. 21, 2001, which is incorporated herein by reference to the extent not inconsistent with the claimed aspects and disclosure herein.

The processing chamber 600 may be integrated into an integrated processing platform, such as an Endura™ platform also available from Applied Materials, Inc. Details of the Endura™ platform are described in commonly assigned U.S. patent application Ser. No. 09/451,628, entitled "Integrated Modular Processing Platform", filed on Nov. 30, 1999, which is incorporated herein by reference to the extent not inconsistent with the claimed aspects and disclosure herein.

FIG. 6 is a schematic cross-sectional view of one embodiment of a substrate processing chamber 610 including one or more valve assemblies 600 mounted below a chamber body 620 of the substrate processing chamber 610. The valve assemblies 600 are coupled to gas lines 655 plumbed through the chamber body 620. The gas lines 655 are, in turn, coupled to gas conduits 650 to provide one or more gases into the chamber body 620. The valve assemblies may also be mounted to other substrate processing chambers and may be mounted to other chamber components.

Referring to FIG. 6, each valve assembly 600 includes a valve body 610 and a diaphragm assembly 630. The valve body 610 includes a valve chamber 611 in fluid communication with three ports including a reactant inlet 612, a purge inlet 614, and an outlet 616. The reactant inlet 612 is in fluid communication with a reactant source 613 to supply a reactant through the valve chamber 611, through the outlet 616, through the gas line 655, through the gas conduit 650, and into the chamber body 620. The purge inlet 614 is in fluid communication with a purge gas source 615 and is adapted to supply a purge gas through the valve chamber 611, through the outlet 616, through the gas line 655, through the gas conduit 650, and into the chamber body 620. If the substrate processing chamber 610 includes two or more valve assemblies 600, the purge inlet 614 of each valve assembly 600 is preferably coupled to separate purge gas sources 615. In other embodiments, the purge inlet 614 of each valve assembly 600 may be coupled to a common purge gas source.

Referring to FIG. 6, an electronically controlled valve 652, such as a solenoid valve, may be mounted to the diaphragm assembly 630 to selectively provide a pressurized gas from a pressurized gas supply 650, such as air or other gas, coupled to the electronically controlled valve 652 through a gas line 651. Programmable logic controllers (PLC) are coupled to the electronically controlled valves 652 to control electrical signals to the electronically controlled valve 652. The programmable logic controllers are in turn coupled to a main controller which controls the programmable logic controller. Although an electronically controlled valve provides pressurized gas to the diaphragm assembly 630, the valve assembly 600 is a pneumatically actuated valve.

In one embodiment, argon is used as the carrier gas at a flow rate 500 sccm, ammonia enters the chamber at a flow rate of 1500 sccm, and the argon purge flow is at a flow rate 8000 sccm.

Post-Deposition Treatment Options

After the dielectric deposition, the substrate may be treated with a plasma, seed layer deposition, or adhesion layer deposition before the bulk metal deposition step. The plasma treatment may comprise argon, nitrogen, or hydrogen plasma. The seed layer deposition may comprise copper, copper aluminum, copper tin, tantalum, tungsten, thallium, cobalt, titanium, aluminum, another metal, or combinations of metals. Methods of deposition include ALD, CVD, PVD, electroplating or electroless plating. The adhesion layer may comprise tantalum, titanium, aluminum, or tungsten.

Optional Tantalum Layer

Figure 9C:
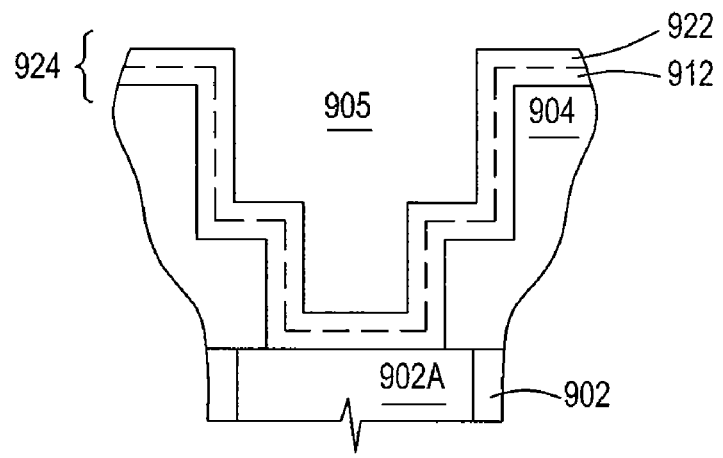
Figure 9D:
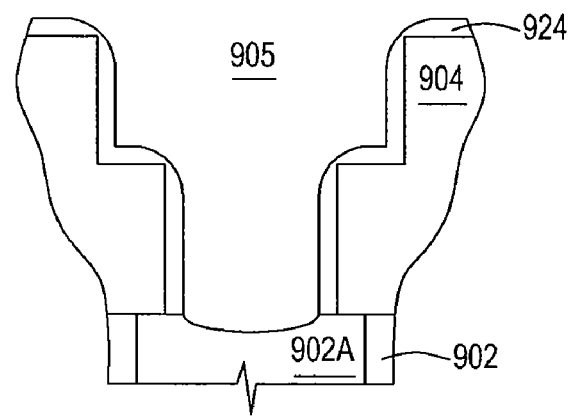

FIG. 9C shows a tantalum layer 922 deposited over the tantalum nitride layer 912, such as after step 104. The tantalum layer 922 and the tantalum nitride layer 912 together make up barrier layer 924. In one aspect, the tantalum layer 922 provides good adhesion with the seed layer 942 (FIG. 9F). In another aspect tantalum nitride 912 and tantalum 922 have good adhesion with each other. In one embodiment, the temperature of the substrate support is unheated (i.e. room temperature). In one embodiment of the tantalum layer deposition, argon is provided between 12 and 36 sccm to a PVD deposition chamber. A RF substrate bias of between about 100 Watts and about 1000 Watts may be provided to the substrate support during deposition of the tantalum layer 922. The DC power supplied to the PVD deposition may be 40 kW with an optional RF power of 2 kW. The tantalum layer is deposited to a thickness of about 75 Å or less, preferably between about 40 Å and about 60 Å.

Not wishing to be bound by theory unless explicitly set forth in the claims, it is believed that the conformal ALD tantalum nitride layer 912 helps cause growth of low resistivity alpha-phase tantalum at least over portions thereover, such as on the bottom of the aperture or over field areas, during physical vapor deposition. It is also believed that the wafer bias during physical vapor deposition helps in the formation of low resistivity alpha-phase tantalum Punch-Through FIG. 9D shows a punch through step performed to remove at least a portion of tantalum nitride and tantalum at the bottom of the aperture 905. Preferably, etch step is performed to remove tantalum nitride and tantalum at the bottom of the aperture 905 to reveal conductive portion 902A of the underlying layer 902. In one aspect, the tantalum nitride and tantalum remaining at the sidewalls prevent copper diffusion of the sputtered conductive material, such as copper, from a conductive portion 902A, such as a copper conductive portion, into the dielectric layer 904. The punch-through step also removes an oxide formation, residues (such as patterning residues), and other contaminants which may have formed over the conductive portion 902A.

The etch preferably comprises an argon plasma etch. A directional argon plasma etch is used to ensure that the plasma etch will reach the bottom of the aperture 905. The conditions for the etch are dependent on the design parameters of the chamber and the substrate support. RF wafer bias is between about 100 Watts and about 1000 Watts and is performed for a time period of between about 1 second and about 20 seconds depending on the desired thickness of the tantalum nitride and tantalum to be removed.

In one embodiment of the argon plasma etch, argon is provided at a flow rate of 12 sccm. The DC power supplied to the system is 0 W. The RF power is 2000 W, the DC coil has a power of 800 W, and the wafer bias is 600 W.

Optional Tantalum Flash

Figure 9E:
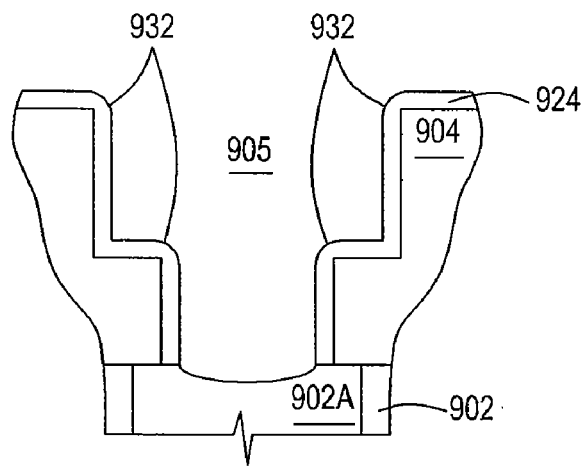
Figure 9F:
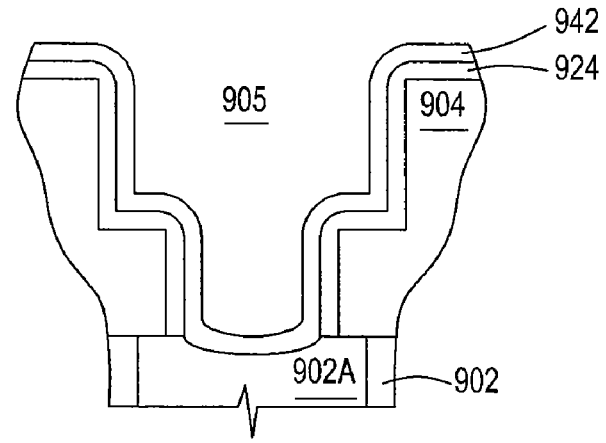

FIG. 9E shows an optional tantalum physical vapor deposition flash step. It is intended that the tantalum physical vapor deposition flash step deposits tantalum at the bevel corners 932 to help build up tantalum at the bevel corners 932 which may have been etched during the punch-through step. The tantalum flash step is preferably performed with a low wafer bias to reduce tantalum deposition at the bottom of the aperture 905.

Optional Seed Layer

FIG. 9F shows a seed layer 942 deposited over the substrate structure of FIG. 9D or FIG. 9E. The seed layer 942 may comprise a copper seed layer, a copper alloy seed layer, another metal seed layer, and combinations thereof. Preferably, the seed layer 942 comprises a copper seed layer, a copper alloy seed layer, or combinations thereof.

Because the punch-through step reduces or removes the thickness of tantalum nitride layer 912 and tantalum layer 922 at the bottom of the aperture 905, the resistance of the interconnect structure is reduced. In one embodiment, a copper-to-copper interface may be provided between the seed layer 942 comprising copper and a conductive portion 902A comprising copper. In addition, because the punch-through step reduces or removes the tantalum nitride layer 912 and tantalum layer 922 at the bottom of the aperture 905 a thicker tantalum nitride layer 912 may be initially deposited. For these reasons and other reasons discussed herein, device performance and reliability are improved.

Referring to FIG. 1, physical vapor deposition of tantalum of step 104 is performed in a PVD chamber, such as an ionized metal plasma (IMP) PVD chamber. Examples of IMP PVD chambers include a Self-Ionized Plasma 51p™ chamber or an EnCoRe™ Ta chamber, available from Applied Materials, Inc. of Santa Clara, Calif. The punch-through step 106 may be performed in a suitable plasma-processing chamber. The tantalum physical vapor deposition step 108 may be performed in a suitable PVD chamber. For through-put and particle generation concerns, steps 104-108 are preferably performed in the same processing chamber.

Figure 2:
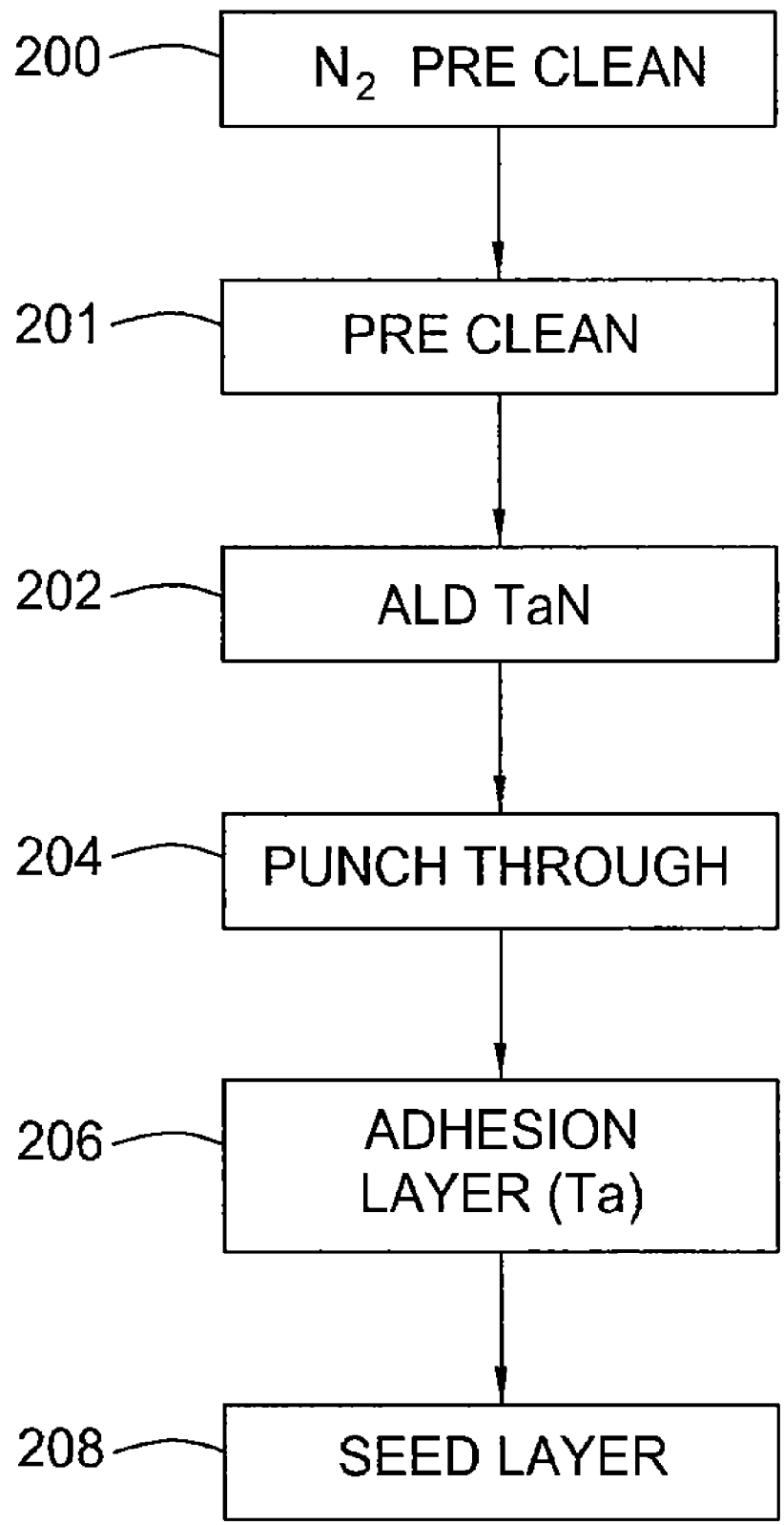
FIG. 2 illustrates another embodiment of a process utilizing an ALD tantalum nitride layer in one stage in the formation of metal interconnect structures.

Continuing to refer to FIG. 1, a seed layer is at least partially deposited on the barrier layer, as shown at step 110. The seed layer may be deposited using any conventional deposition technique, such as chemical vapor deposition (CVD), physical vapor deposition (PVD), electroplating, or electroless plating. For example, the seed layer may be deposited in an IMP PVD chamber. In one aspect, the seed layer is a conventional copper seed layer. In another aspect, the seed layer is a copper alloy seed layer. In still another aspect, the seed layer is a multi-layer seed layer of the same or different metals and alloys Alternative Embodiment FIG. 2 illustrates another embodiment of a process of utilizing ALD tantalum layer in one stage in the formation of metal interconnect structures. In step 202, tantalum nitride is deposited by atomic layer deposition over a substrate structure. In step 204, a punch-through step is performed to remove a portion of the tantalum nitride deposited in step 202. In step 206, an adhesion layer, such as a tantalum layer or a suitable metal, is deposited over the resulting substrate structure of step 204. In step 208, a seed layer is formed over the adhesion layer. All or a partial number of steps 202 through 208 may be performed on an integrated processing system, such as the system of FIG. 4.

Figure 10:
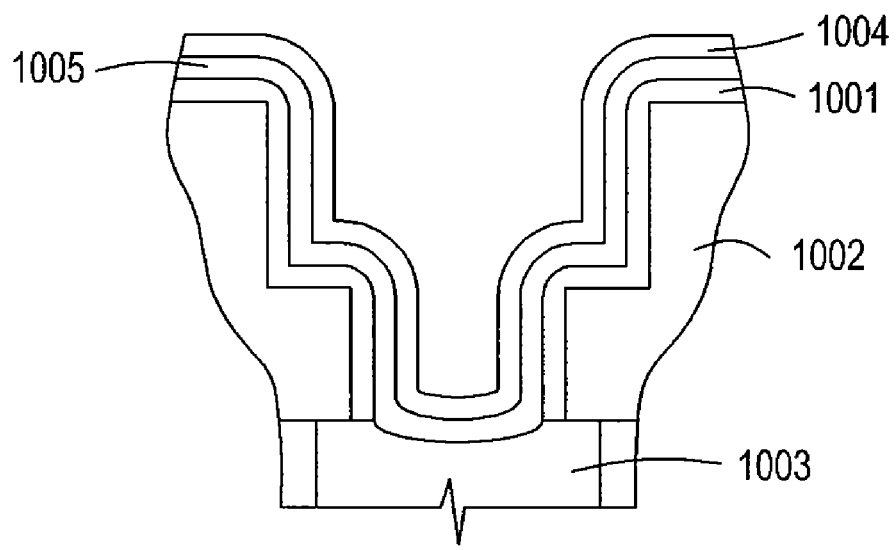
FIG. 10 is a schematic representation of an exemplary substrate structure at a stage in the process of FIG. 2.

FIG. 10 is a schematic representation of an example of a resulting substrate structure after step 208 of FIG. 2. In one aspect, the tantalum nitride layer 1001 is deposited in step 202 to a thickness of about 50 Å or less, preferably between about 5 Å and about 30 Å. The tantalum nitride layer 1001 protects the sidewalls of the dielectric layer 1002 from sputter conductive material 1004, such as copper, from a conductive portion of an underlying layer 1003 below the dielectric layer 1002. The punch-through step is performed for preferably about 10 seconds or less. One advantage of the present process is that the punch-through step need only remove a portion of the tantalum nitride in order to expose a conductive portion of the underlying layer.

Additional Alternative Embodiment

Figure 3A:
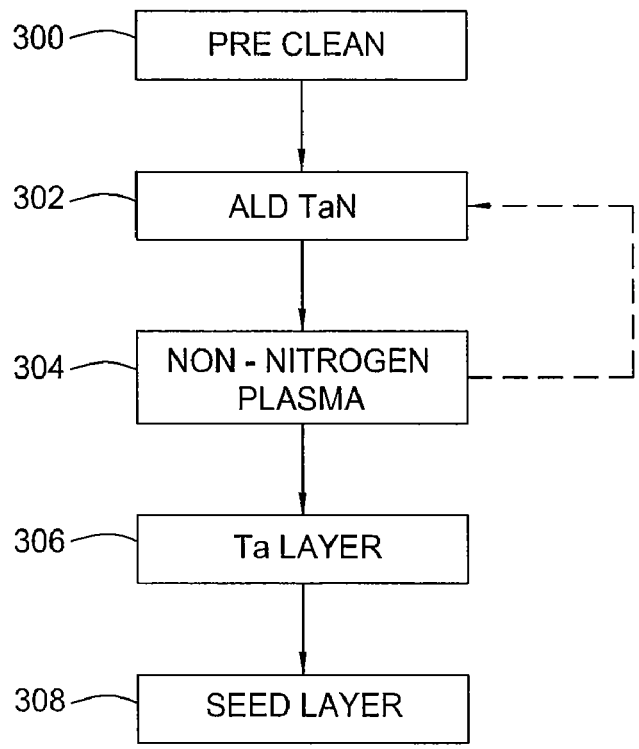
FIG. 3A illustrates yet another embodiment of a process utilizing an ALD tantalum nitride layer in one stage in the formation of metal interconnect structures.

FIG. 3A illustrates yet another embodiment of a process of utilizing ALD tantalum nitride layer in one stage in the formation of metal interconnect structures. In step 302, tantalum nitride is deposited by atomic layer deposition over a substrate structure. In step 304, the tantalum nitride layer is exposed to a non-nitrogen plasma. Preferably, the non-nitrogen plasma comprises a noble gas, such as argon. The non-nitrogen plasma may further include hydrogen or other non-nitrogen gases. Optionally, steps 302 and 304 may be repeated. For example, a non-nitrogen plasma treatment may be performed after a number cycles, for example after every 20 cycles, until a desired amount of tantalum nitride has been deposited. Multiple non-nitrogen plasma treatments help to treat the tantalum nitride at the bottom of the aperture. In step 306, an optional tantalum layer may be deposited over the plasma-treated tantalum nitride layer. In step 308, a seed layer is formed over the resultant substrate structure of step 304 or 306. All or a partial number of steps 302 through 308 may be performed on an integrated processing system, such as the system of FIG. 4.

Figure 11:
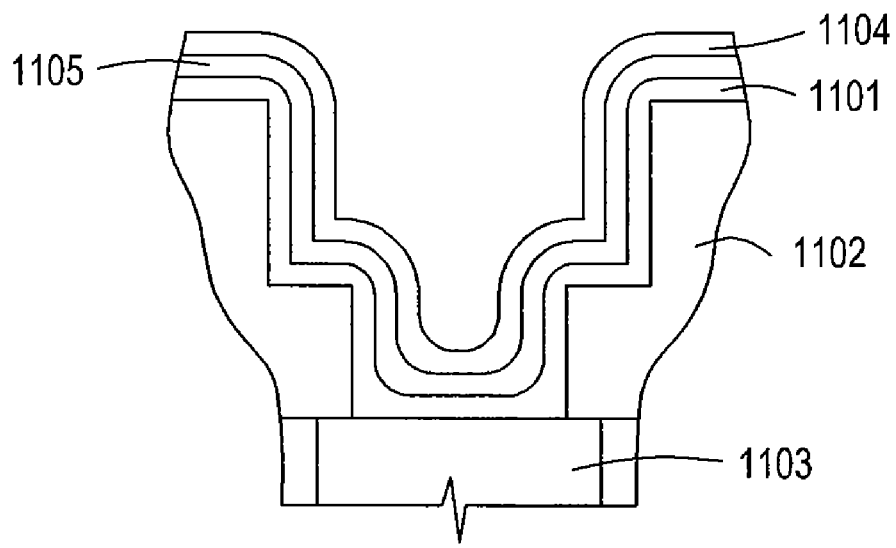
FIG. 11 is a schematic representation of an exemplary substrate structure at a stage in the process of FIG. 3A.

FIG. 11 is a schematic representation of an example of a resulting substrate structure after step 308 of FIG. 3A. In one aspect, it is believed that the non-nitrogen plasma treatment reduces the nitrogen content of the ALD tantalum nitride layer 1101. Since the nitrogen content of the ALD tantalum nitride layer 1101 is reduced, the resistivity of thereof is reduced and thus the contact resistance is reduced.

Multiple ALD Tan Deposition Steps

Figure 3B:
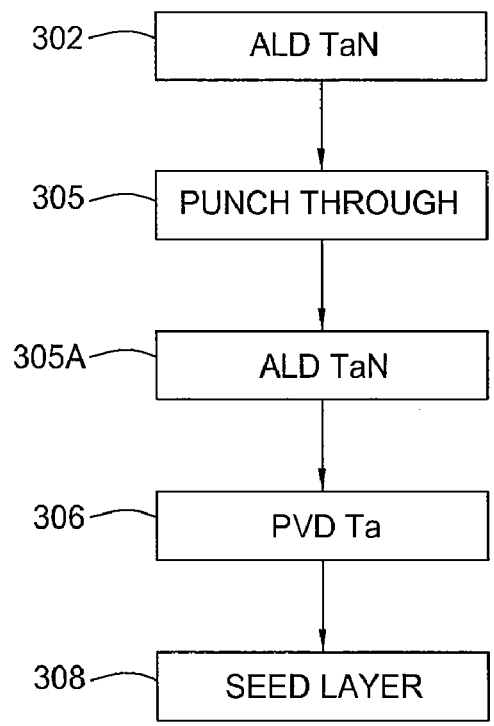
FIG. 3B illustrates an embodiment of a process utilizing two ALD tantalum nitride deposition steps in the formation of metal interconnect structures.

FIG. 3B illustrates yet another embodiment of a process of utilizing ALD tantalum nitride layer in one stage in the formation of metal interconnect structures. In step 302, tantalum nitride is deposited by atomic layer deposition over a substrate structure. In step 305, the tantalum nitride layer is exposed to a punch through step. An additional tantalum nitride layer is deposited in step 305A. In step 306, an optional tantalum layer may be deposited over the plasma-treated tantalum nitride layer. In step 308, a seed layer is formed over the resultant substrate structure of step 304 or 306. All or a partial number of steps 302 through 308 may be performed on an integrated processing system, such as the system of FIG. 4.

Experimental Results

Figure 12:
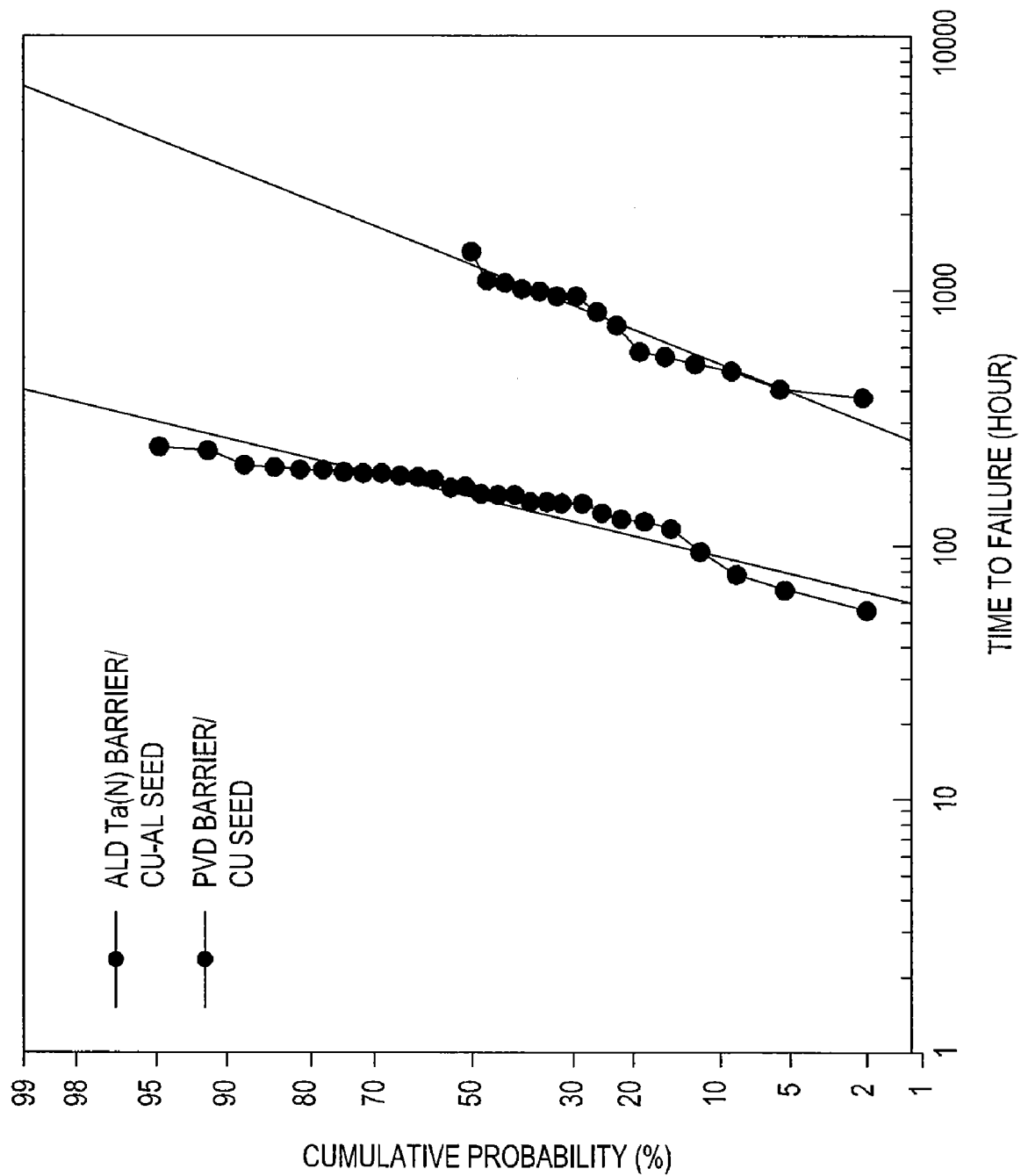
FIG. 12 compares cumulative probability as a function of time to failure for ALD tantanlum nitride with copper-aluminum seed and PVD barrier with copper seed.

FIG. 12 illustrates the cumulative probability as a function of time to failure for ALD tantalum nitride barrier with a copper aluminum seed and for a PVD barrier with a copper seed. The lifetime distribution is improved with the copper aluminum alloy seed used with an ALD tantalum nitride barrier.

Figure 13:
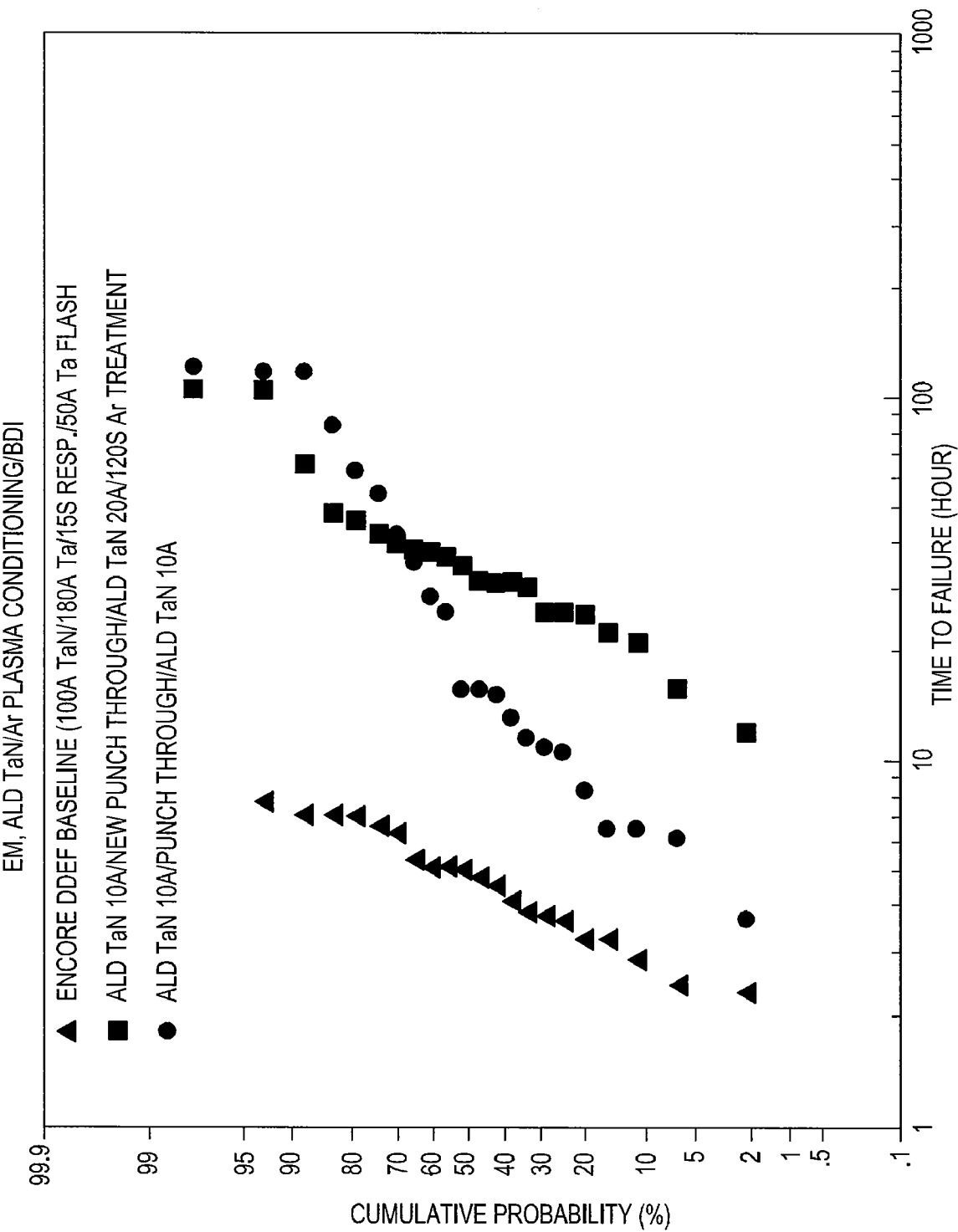
FIG. 13 compares cumulative probability as a function of time to fail for ALD tantalum nitride with punchthrough and ALD tantalum nitride layers; ALD tantalum nitride with new punchthrough, ALD tantalum nitride layers, and argon treatment; and a baseline with tantalum nitride, tantalum, and tantalum flash.

FIG. 13 compares cumulative probability as a function of time to failure for ALD tantalum nitride with punchthrough and ALD tantalum nitride layers; ALD tantalum nitride with new punchthrough ALD tantalum nitride layers, and argon treatment; and a baseline with tantalum nitride, tantalum, and tantalum flash. The temperature was 350° C. There was 1.5 ma/cm$^2$ link current density. There was upstream direction current. Flow was proportional to (μm) via/link size. Old punch through had DC power less than 150 W and a wafer bias of 600 W. New punchthrough had DC power of 3000 W and a wafer bias of 800 W. This dramatic increase in time to failure illustrates the desirable properties of the improvement.

Final Steps

Referring to FIG. 1, 2, 3A, or 3B subsequent to seed layer formation in step 410, step 708, or step 808, a bulk metal layer is at least partially deposited on the seed layer. The metal layer may also be deposited using any conventional deposition technique, such as electroplating, electroless plating, chemical vapor deposition (CVD), or physical vapor deposition (PVD). The metal layer preferably includes any conductive material such as copper, aluminum, tungsten, or combinations thereof. The metal layer preferably comprises a bulk copper layer.

In one embodiment, preferably, the bulk copper layer is formed within an electroplating cell, such as the Electra™ Cu ECP system, available from Applied Materials, Inc., of Santa Clara, Calif. A copper electrolyte solution and copper electroplating technique is described in commonly assigned U.S. Pat. No. 6,113,771, entitled "Electro-deposition Chemistry", which is incorporated by reference herein. Typically, the electroplating bath has a copper concentration greater than about 0.7M, a copper sulfate concentration of about 0.85, and a pH of about 1.75. The electroplating bath may also contain various additives as is well known in the art. The temperature of the bath is between about 15° C. and about 250°. The bias is between about ±15 volts to about 15 volts. In one aspect, the positive bias ranges from about 0.1 volts to about 10 volts and the negatives bias ranges from about −0.1 to about −10 volts.

Optionally, an anneal treatment may be performed following the metal layer deposition. For example, the wafer may be subjected to a temperature between about 100° C. and about 400° C. for between about 1 minute to about 1 hour. A carrier/purge gas such as helium, hydrogen, nitrogen, or a mixture thereof is introduced at a rate of about 100 sccm to about 10,000 sccm. The chamber pressure is maintained between about 2 Torr and about 10 Torr.

Following deposition, the top portion of the resulting structure may be planarized. A chemical mechanical polishing (CMP) apparatus may be used, such as the Mirra™ System available from Applied Materials, Santa Clara, Calif., for example. Optionally, the intermediate surfaces of the structure may be planarized between the deposition of the subsequent layers described above.

While the foregoing is directed to embodiments of the present invention, other and further embodiments of the invention may be devised without departing from the basic scope thereof, and the scope thereof is determined by the claims that follow.

The invention claimed is:

1. A method for forming a metal interconnect on a substrate, comprising:
    exposing the substrate to a nitrogen plasma during a pre-clean process prior to depositing a tantalum nitride barrier layer;
    depositing the tantalum nitride barrier layer on the substrate by an atomic layer deposition process within a first processing chamber;
    depositing a tantalum barrier layer over the tantalum nitride barrier layer within a second processing chamber;
    plasma etching the tantalum barrier layer and the tantalum nitride barrier layer to expose an underlying conductive material layer within a third processing chamber; and
    depositing a seed layer over the underlying conductive material and the tantalum barrier layer within a fourth processing chamber, wherein the first processing chamber, the second processing chamber, the third processing chamber, and the fourth processing chamber are disposed within an integrated tool.

2. The method of claim 1, wherein the tantalum nitride barrier layer is deposited during the atomic layer deposition process by exposing the substrate to a tantalum precursor selected from the group consisting of t-butylimino-tris(diethylamino) tantalum, pentakis(ethylmethylamino) tantalum, pentakis(dimethylamino) tantalum, pentakis(diethylamino) tantalum, t-butylimino-tris(ethylmethylamino) tantalum, t-butylimino-tris(dimethylamino) tantalum, bis(cyclopentadienyl)tantalum trihydride, and bis(methylcyclopentadienyl)tantalum trihydride.

3. The method of claim 2, wherein the tantalum nitride barrier layer is deposited during the atomic layer deposition process by exposing the substrate to a nitrogen precursor selected from the group consisting of ammonia, hydrazine, methylhydrazine, dimethylhydrazine, t-butylhydrazine, phenylhydrazine, azoisobutane, and ethylazide.

4. The method of claim 1, wherein a process gas is injected into the third processing chamber during the plasma etching, and the process gas is selected from the group consisting of argon, nitrogen, and hydrogen.

5. The method of claim 4, wherein the plasma etching is performed with a directional argon plasma.

6. The method of claim 1, further comprising depositing additional metal by physical vapor deposition on the tantalum barrier layer.

7. The method of claim 6, further comprising depositing a bulk metal layer over the seed layer.

8. The method of claim 6, wherein the additional metal comprises a material selected from the group consisting of copper, copper aluminum, copper tin, tantalum, tungsten, thallium, cobalt, titanium, and aluminum.

9. The method of claim 1, wherein the third and fourth processing chambers are the same chamber.

10. The method of claim 1, wherein the second and fourth processing chambers are the same chamber.

11. The method of claim 1, wherein the seed layer is deposited by a process selected from the group consisting of chemical vapor deposition, physical vapor deposition, electroplating, and electroless plating.

12. The method of claim 1, wherein the seed layer comprises a metal selected from the group consisting of copper, copper aluminum, copper tin, tantalum, tungsten, thallium, cobalt, titanium, and aluminum.

13. The method of claim 1, wherein the substrate comprises a dielectric layer having an aperture formed therein.

14. The method of claim 13, wherein the aperture exposes a portion of the underlying conductive material layer.

15. A method for forming a metal interconnect on a substrate, comprising:
    exposing the substrate to a nitrogen plasma during a pre-clean process prior to depositing a tantalum nitride barrier layer;
    depositing the tantalum nitride barrier layer on the substrate by an atomic layer deposition process within a first processing chamber;
    depositing a tantalum barrier layer over the tantalum nitride barrier layer within a second processing chamber;
    plasma etching the tantalum barrier layer and the tantalum nitride barrier layer to expose an underlying conductive material layer within a third processing chamber;

depositing additional metal by physical deposition on the tantalum barrier layer; and depositing a seed layer over the underlying conductive material and the tantalum barrier layer within a fourth processing chamber, wherein the first processing chamber, the second processing chamber, the third processing chamber, and the fourth processing chamber are disposed within an integrated tool, and wherein depositing additional metal by physical vapor deposition on the tantalum barrier layer comprises depositing tantalum at bevel corners of the tantalum barrier layer to replace tantalum removed while plasma etching the tantalum barrier layer and the tantalum nitride barrier layer.

* * * * *